United States Patent
Yamada et al.

(10) Patent No.: US 7,250,971 B2
(45) Date of Patent: Jul. 31, 2007

(54) CHARGE READ-OUT METHOD AND SOLID-STATE IMAGING DEVICE CAPABLE OF SHORTENING READ-OUT TIME CHARGES STORED IN A PLURALITY OF LIGHT RECEIVING UNITS

(75) Inventors: Tetsuo Yamada, Miyagi-ken (JP); Jin Murayama, Miyagi-ken (JP); Tatsuya Hagiwara, Miyagi-ken (JP); Satoshi Arakawa, Kaisei-machi (JP); Hiroaki Yasuda, Kaisei-machi (JP)

(73) Assignee: Fujifilm Corporation, Tokyo (JP)

( * ) Notice: Subject to any disclaimer, the term of this patent is extended or adjusted under 35 U.S.C. 154(b) by 666 days.

(21) Appl. No.: 10/050,573

(22) Filed: Jan. 18, 2002

(65) Prior Publication Data

US 2002/0097331 A1 Jul. 25, 2002

(30) Foreign Application Priority Data

Jan. 22, 2001 (JP) .............................. 2001-012864

(51) Int. Cl.
*H04N 3/14* (2006.01)
(52) U.S. Cl. ...................... 348/316; 348/315; 348/323; 348/324
(58) Field of Classification Search ........ 348/311–324, 348/282
See application file for complete search history.

(56) References Cited

U.S. PATENT DOCUMENTS

| 5,051,798 | A | * | 9/1991 | Kimura ........................ 257/229 |
| 5,274,476 | A | * | 12/1993 | Lee ............................. 358/483 |
| 6,144,407 | A | * | 11/2000 | Mizutani et al. ......... 348/220.1 |
| 6,153,874 | A | * | 11/2000 | Monoi ....................... 250/208.1 |
| 6,331,873 | B1 | * | 12/2001 | Burke et al. ................. 348/314 |
| 6,337,713 | B1 | * | 1/2002 | Sato ........................... 348/311 |
| 2004/0028286 | A1 | * | 2/2004 | Saigusa et al. ............. 382/264 |

\* cited by examiner

*Primary Examiner*—Ngoc Yen Vu
(74) *Attorney, Agent, or Firm*—Sughrue Mion, PLLC

(57) ABSTRACT

A charge read-out method and a solid-state imaging device capable of shortening a read-out time of charges stored in a plurality of light receiving units arranged linearly are provided. The charge read-out method includes the steps of moving the charges, which are generated and stored in the plurality of light receiving units linearly arranged by receiving light, to charge transfer paths disposed along a row of the light receiving units on both sides thereof, transferring the charges along the charge transfer paths to an output unit, and calculating a sum of converted values based on amounts of the charges transferred from the charge transfer paths for outputting.

11 Claims, 10 Drawing Sheets

CHARGE READ-OUT METHOD AND SOLID-STATE IMAGING DEVICE CAPABLE OF SHORTENING READ-OUT TIME CHARGES STORED IN A PLURALITY OF LIGHT RECEIVING UNITS

BACKGROUND OF THE INVENTION

1. Field of the Invention

The present invention relates to a charge read-out method and a solid-state imaging device, and specifically to a charge read-out method and a solid-state imaging device for reading out charges generated in a plurality of light receiving units arranged linearly.

2. Description of the Related Art

An apparatus using a line sensor for detecting light with a plurality of light receiving units linearly arranged has been heretofore known. For example, in some radiation image recording and reproducing systems, line sensors for detecting radiation images are incorporated.

The radiation image recording and reproducing system using the line sensor utilizes a storage phosphor (photostimulable phosphor), which stores a part of radiation energy when irradiated with radioactive rays (X-rays, alpha-rays, beta-rays, gamma-rays, electron beams, ultraviolet rays or the like), and then provides stimulated emission in accordance with the stored energy by irradiation of excitation light such as visible light. By utilizing the storage phosphor, the radiation image recording and reproducing system temporarily records radiation image information of a subject such as a human body on a storage phosphor sheet composed of a sheet-shaped storage phosphor layer, then scans the storage phosphor sheet with excitation light to generate stimulated emission light, and photoelectrically detects stimulated emission light with the line sensor to obtain image signals. Consequently, based on the obtained image signals, the system displays a radiation image of the subject as a visible image on a recording medium such as a photosensitive material or a display apparatus such as a CRT.

The line sensor receives the stimulated emission light generated from the storage phosphor sheet with a plurality of light receiving units arranged linearly, and moves charges generated and stored in the light receiving units to a charge transfer path disposed along a row of the light receiving units. Then, the line sensor transfers and outputs the moved charges through the charge transfer path for reading out the charges. Specifically, the charges stored in each of the light receiving units are moved from only one side of the row of the light receiving units to the charge transfer path.

A read-out time of charges stored in each of the light receiving units is determined on the sum of a time for moving all the charges generated and stored in each of the light receiving units to the charge transfer path and a time for transferring and outputting the charges moved to the charge transfer path along the charge transfer path.

The time for moving all the charges stored in the light receiving units to the charge transfer path is the time required for all the charges in each of the light receiving units to be moved at random and captured in the charge transfer path having a lower potential than that of the light receiving unit. The movement of the charges moving at random is mainly controlled by a repulsive motion of the charges (repulsive motion between charges of the same polarity) in the case of a large amount of charges, and is controlled by thermal diffusion in the case of a small amount of charges.

Since the stimulated emission light generated from the storage phosphor sheet is very weak, it is desired that a larger quantity of the stimulated emission light be received from the generated light. In order to receive a larger quantity of the stimulated emission light, taking into consideration diffusion of the stimulated emission light generated from the storage phosphor sheet, it is conceived that each of the light receiving units is increased in dimension in a direction (hereinafter, referred to as a cross-line direction) substantially orthogonal to a direction of a line in which the light receiving units are arranged linearly, thus increasing a light receiving area of each of the light receiving units. Accordingly, the quantity of the stimulated emission light received is increased.

However, a larger length of the light receiving unit in the cross-line direction requires a longer time for all the charges stored in the light receiving unit to be moved to the charge transfer path in accordance with the length, thus increasing the read-out time of the charges.

In other words, if the light receiving unit is increased in dimension in the cross-line direction (if the depth is lengthened without changing the exit size) while not changing in dimension of an exit of the charges through which the charges stored in the light receiving unit are moved to the charge transfer path (dimension with which the light receiving unit is electrically connected to the charge transfer path so as to move the charges thereto), the possibility that the charges moving at random in the light receiving unit are captured in the charge transfer path through the exit of the light receiving unit(the possibility per a unit of time), is lowered. Accordingly, the time for moving all the charges stored in the light receiving unit to the charge transfer path is increased.

As a result, the read-out time of the charges stored in the light receiving unit is increased, causing a problem that the charges stored in the line sensor by receiving the stimulated emission light, which is generated from the storage phosphor sheet, cannot be read out within a predetermined period of time.

SUMMARY OF THE INVENTION

The present invention was made with the foregoing problem in mind, and an object of the present invention is to provide a charge read-out method and a solid-state imaging device capable of shortening a read-out time of charges stored in a plurality of light receiving units arranged linearly.

The charge read-out method of the present invention comprises the steps of: moving charges into a plurality of charge transfer paths disposed on both sides of a row of a plurality of light receiving units linearly arranged, the charges being generated and stored in the plurality of light receiving units having received light; and transferring and outputting the moved charges along the light receiving paths disposed on both sides of the plurality of light receiving units.

The solid-state imaging device of the present invention comprises: a plurality of light receiving units linearly arranged for receiving light to generate and store charges; a plurality of charge transfer paths disposed on both sides of the plurality of light receiving units for receiving the charges stored in the plurality of light receiving units and for transferring and outputting the received charges; a controller for moving the charges stored in the plurality of light receiving units into the plurality of charge transfer paths, and for transferring and outputting the charges moved into the plurality of charge transfer paths disposed on both sides of the plurality of light receiving units.

Each of the plurality of light receiving units includes a plurality of segments separated by a potential barrier so that charges stored in the plurality of light receiving units can be moved to the plurality of charge transfer paths.

The plurality of segments are four segments obtained by separating each of the plurality of light receiving units with a cruciform potential barrier.

Note that the foregoing both sides are positions sandwiching the light receiving units in an orthogonal direction of the linear row of the plurality of the light receiving units in a plane parallel to light receiving surfaces of the light receiving units.

The aforementioned potential barrier means a barrier by a potential difference, which obstructs movement of charges generated in the light receiving units by setting a potential in a certain region in each of the light receiving units to be a different potential from the other regions.

The cruciform separation means that each of the light receiving units is separated in a line direction as well as in a cross-line direction.

According to the charge read-out method and the solid-state imaging device of the present invention, because the charge transfer paths are disposed along a row of the light receiving units on both sides thereof, and charges stored in the light receiving units are moved to the charge transfer paths disposed on both sides of the light receiving units, the possibility (the possibility per a unit time) that the charges moving at random in each of the light receiving units are captured in the charge transfer paths is increased, compared to the conventional case of moving the charges only to a charge transfer path disposed on one side of the light receiving units. In other words, in each of the light receiving units having the same shape and area as that in the conventional method, the total exit width for moving the charges to the charge transfer paths are increased. As a result, the time for moving the charges from the light receiving unit to the charge transfer paths is shortened, thus shortening the read-out time of the charges stored in each of the light receiving units.

When the read-out time of the charges may be increased by increasing the dimension of the light receiving unit in a cross-line direction, a remarkable effect of preventing an increase in the read-out time of the charges stored in the light receiving unit can be expected by moving the charges to the charge transfer paths on both sides of the light receiving units.

When each of the light receiving units is designed to include the plurality of segments separated by a potential barrier such that charges stored in the light receiving units can be moved to the charge transfer paths, and further when the plurality of segments are designed to be four segments obtained by separating each of the light receiving units with the cruciform potential barrier, the time for moving the charges from the light receiving unit to the charge transfer paths can be shortened.

DETAILED DESCRIPTION OF THE PREFERRED EMBODIMENTS

Figure 1:
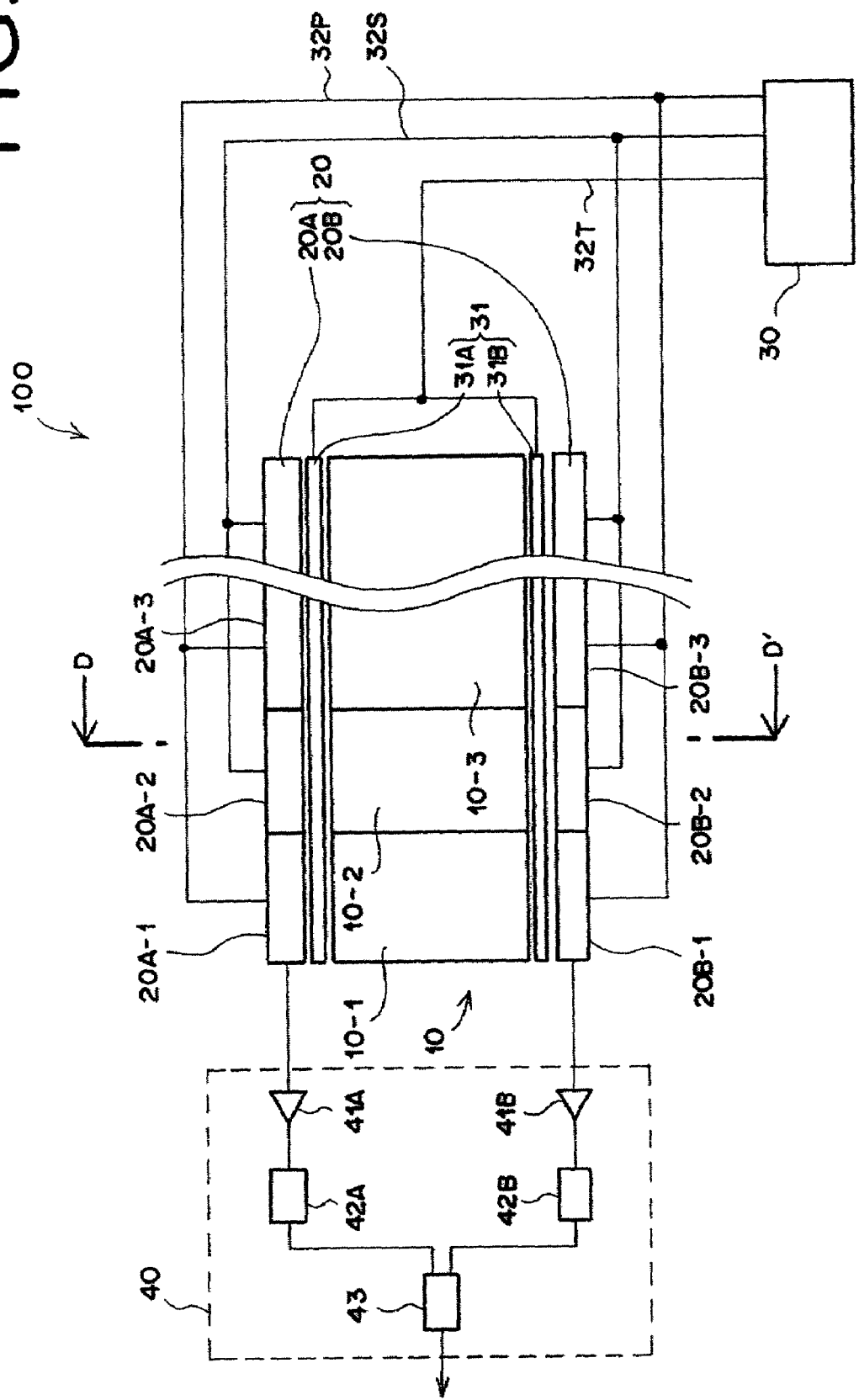
FIG. 1 is a schematic view showing a structure of a solid-state imaging device according to a first embodiment of the present invention.
Figure 2:
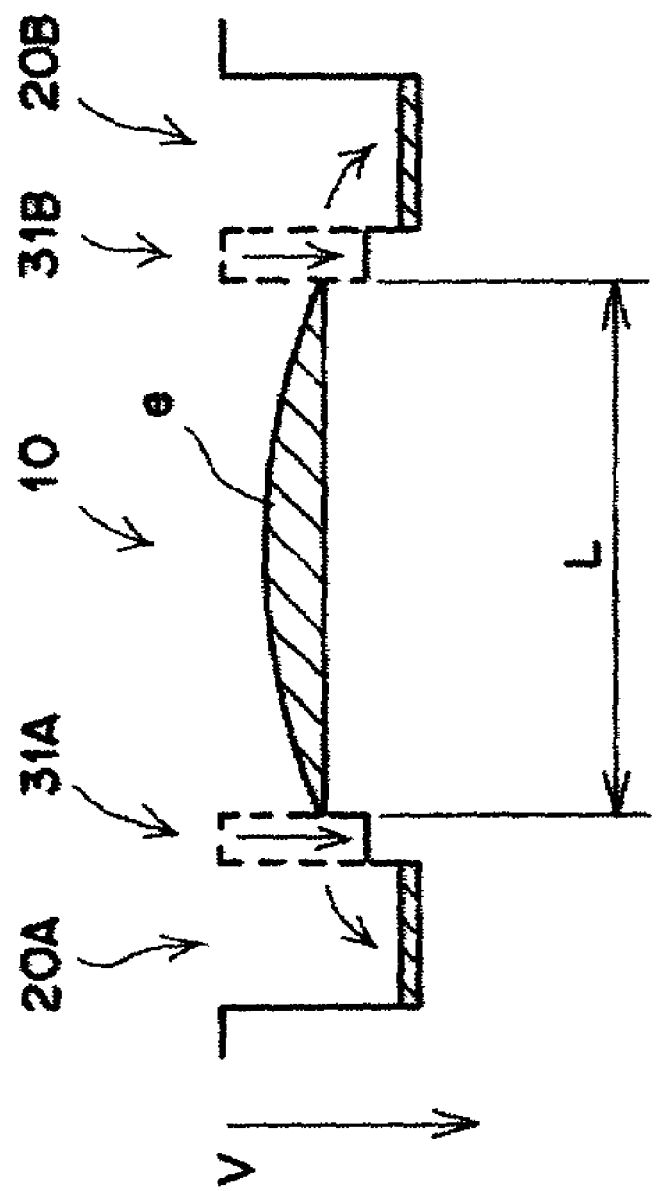
FIG. 2 is a diagram showing a potential distribution at a section taken along a line D-D' of FIG. 1.

Hereinafter, the embodiments of the present invention will be described with reference to the accompanying drawings. FIG. 1 is a schematic view showing a constitution of a solid-state imaging device of a first embodiment, carrying out a charge read-out method according to the present invention. FIG. 2 is a view showing a potential distribution at a section taken along a line D-D' of FIG. 1.

The solid-state imaging device according to the first embodiment of the present invention is the one used in a line sensor for detecting radiation images, the line sensor detecting stimulated emission light generated from storage phosphor sheets. As shown in FIG. 1, a solid-state imaging device 100 includes a plurality of light receiving units 10-1, 10-2, 10-3 . . . arranged linearly (hereinafter, the light receiving units 10-1, 10-2, 10-3 . . . are referred to as light receiving units 10), a charge transfer unit 20, and a controller 30. The light receiving units 10 receive light to generate charges and store the charges. The charge transfer unit 20 receives the charges stored in the light receiving units 10 and transfer and output the received charges. The controller 30 moves the charges stored in the light receiving units 10 to the charge transfer unit 20, and transfers and outputs the charges moved to the charge transfer unit 20.

The charge transfer unit 20 includes charge transfer paths 20A and 20B disposed along a row of the light receiving units 10 on both sides thereof. The controller 30 moves the charges stored in each of the light receiving units 10 to the charge transfer paths 20A and 20B, which are disposed on both sides of the light receiving units 10.

Each of the charge transfer paths 20A and 20B includes transfer electrodes separated along the row of the light receiving units 10. These transfer electrodes as transfer electrodes 20A-1, 20A-2, 20A-3 . . . and transfer electrodes 20B-1, 20B-2, 20B-3 . . . are disposed on both sides of the light receiving units 10-1, 10-2, 10-3 . . . so as to be correspondent to the light receiving units 10-1, 10-2, 10-3 . . . , respectively.

A transfer gate 31A is disposed between the light receiving units 10 and the charge transfer path 20A, and a transfer gate 31B is disposed between the light receiving units 10 and the charge transfer path 20B. The controller 30 controls movement of the charges generated in the light receiving units 10 to the charge transfer paths 20A and 20B by changing potentials of the transfer gates 31A and 31B through potential setting wiring 32T. Moreover, the controller 30 controls a potential and a phase of change in potential of each of the transfer electrodes through electrode potential setting wiring 32P and 32S connected to the transfer electrodes to transfer and out put the charges moved to the charge transfer paths 20A and 20B.

The solid-state imaging device 100 further includes an output unit 40 for converting the charges outputted through the charge transfer paths 20A and 20B to digital signals and outputting the digital signals. The output unit 40 includes charge-voltage converting circuits 41A and 41B for converting the charges transferred and outputted through the charge transfer paths 20A and 20B into voltages, respectively; analog-digital converters (A/D converters) 42A and 42B for analog-digital conversion of the voltages outputted from the charge-voltage converting circuits 41A and 41B, respectively; and a computing unit 43 for calculating and outputting the sum of the digital values outputted from the A/D converters 42A and 42B, respectively.

Next, the operation of the solid state imaging device according to the first embodiment will be described.

Charges are generated and stored in the light receiving units 10 having received the stimulated emission light, which is generated from a storage phosphor sheet (not shown) by scanning with excitation light. When the scanning with the excitation light is finished, potentials of the transfer gates 31A and 31B, which are disposed along the row of the light receiving units 10 on both sides thereof, are lowered (gates are opened) by an instruction of the controller 30, and the charges generated in the light receiving units 10 are started to move to the charge transfer paths 20A and 20B. The charges stored in each of the light receiving units 10-1, 10-2, 10-3 . . . are moved through the transfer gates 31A and 31B to the corresponding transfer electrodes 20A-1, 20A-2, 20A-3 . . . and the transfer electrodes 20B-1, 20B-2, 20B-3 . . . , respectively.

The potential distribution at a section taken along the line D-D' in this case is shown in FIG. 2. When potentials V of the transfer gates 31A and 31B are lowered, the charges e stored in the light receiving units 10, each having a dimension L in the cross-line direction, flow into the charge transfer paths 20A and 20B to be captured. The charge transfer paths 20A and 20B are disposed on both sides of the light receiving units 10 and are set to have lower potentials than the light receiving units 10. The charges moved into each of the transfer electrodes 20A-1, 20A-2, 20A-3 . . . and each of the transfer electrodes 20B-1, 20B-2, 20B-3 . . . are sequentially transferred to the adjacent electrodes by potential control of the control unit 30 through the electrode potential setting wiring 32P and 32S connected to each of the transfer electrodes, and then inputted to the charge-voltage conversion circuits 41A and 41B to be converted into voltages. Thereafter, the voltages are converted into digital values by the A/D converters 42A and 42B. The digital values obtained from the charges stored in the same light receiving unit are added by the computing unit 43. The added value is read out as a value indicating a quantity of stimulating light received by each of the light receiving units.

Next, the time for moving the charges from each of the light receiving units to the charge transfer unit in the above method of moving the charges in the light receiving units into the charge transfer paths on both sides thereof (hereinafter, referred to as a double-side charge moving method) is compared to the time for moving the charges from each of the light receiving units to a charge transfer unit in a method of moving the charges in the above light receiving units only into a charge transfer path on only one side thereof (hereinafter, referred to as a single-side charge moving method).

Figure 3:
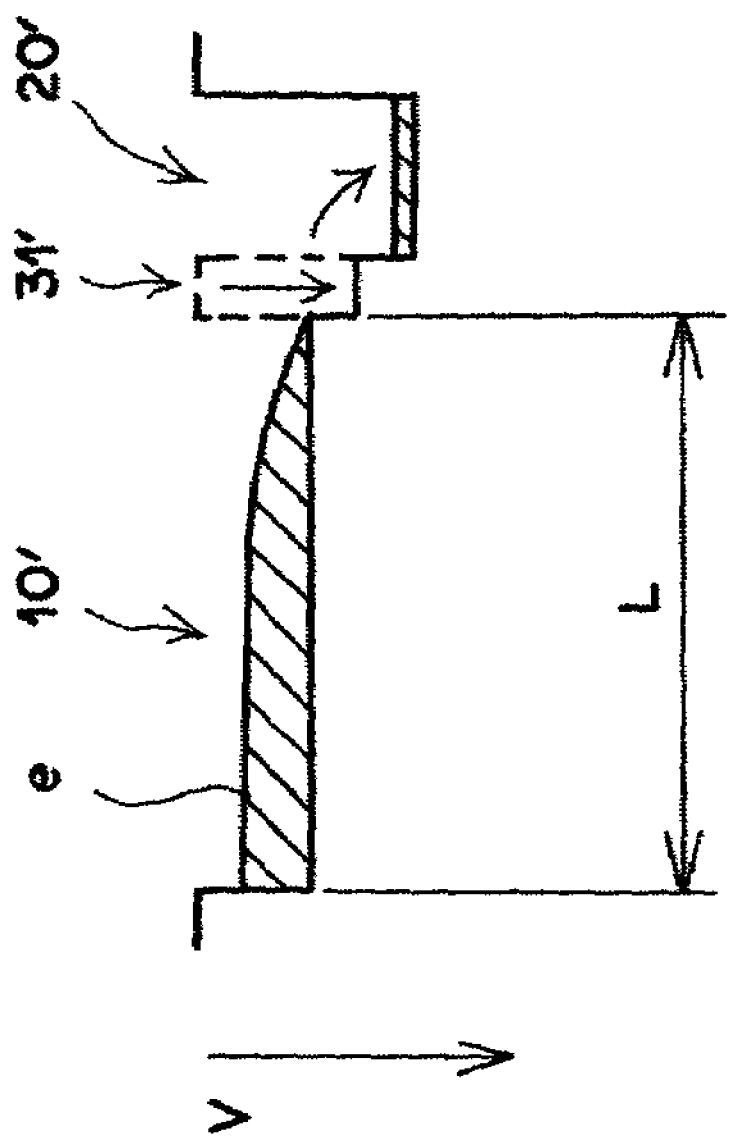
FIG. 3 is a diagram showing a potential distribution of a single-side charge moving method.

FIG. 3 shows a potential distribution in the case of moving the charges stored in each of the light receiving units to the charge transfer unit in the single-side charge moving method using the light receiving unit having the same shape and area as that in the above double-side charge moving method. As apparent from FIG. 3, when the same amount of charges e as those in the double-side charge moving method are stored in each of light receiving units 1010 used in the single-side charge moving method, having the same dimension L in the cross-line direction as that in the double-side charge moving method shown in FIG. 2 and a transfer gate 1031 is opened, the charges stored in the light receiving units 1010 are moved only to a transfer path 1020 disposed on the one side thereof. Accordingly, each of the light receiving units in the above double-side charge moving method has a larger exit width for moving the charges from the light receiving unit to the charge transfer unit, so that the time required for moving the charges, which move at random in the light receiving units, to the charge transfer unit can be shortened.

Note that in the above embodiment an example of the light receiving units arranged linearly only in one line is given, but by arranging a plurality of rows of the light receiving units arranged linearly, a solid-state imaging device may be composed of a plurality of rows of the light receiving units or a solid-state imaging device may be composed of the light receiving units in matrix.

Figure 4:
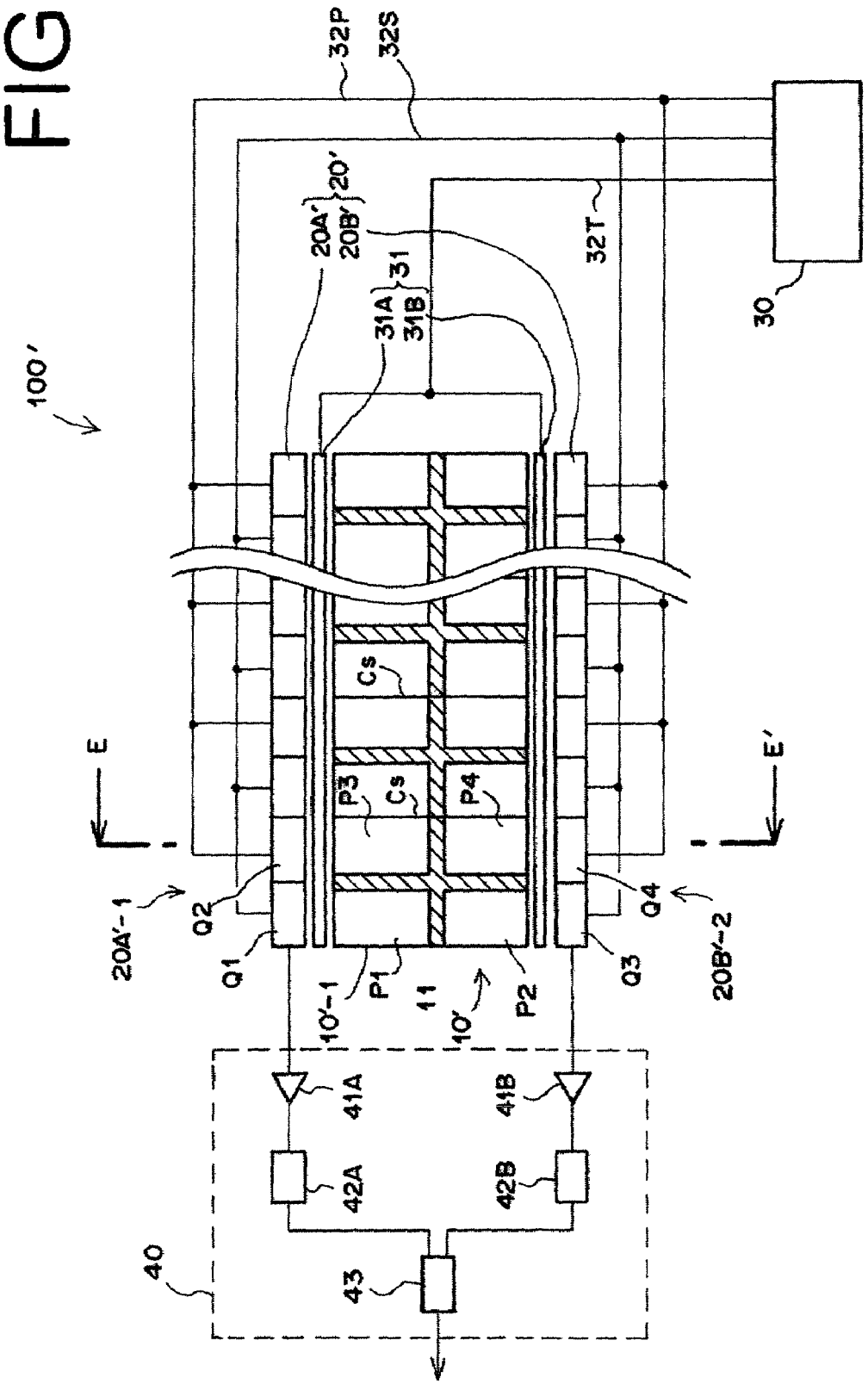
FIG. 4 is a schematic view showing a structure of a solid-state imaging device according to a second embodiment of the present invention.
Figure 5:
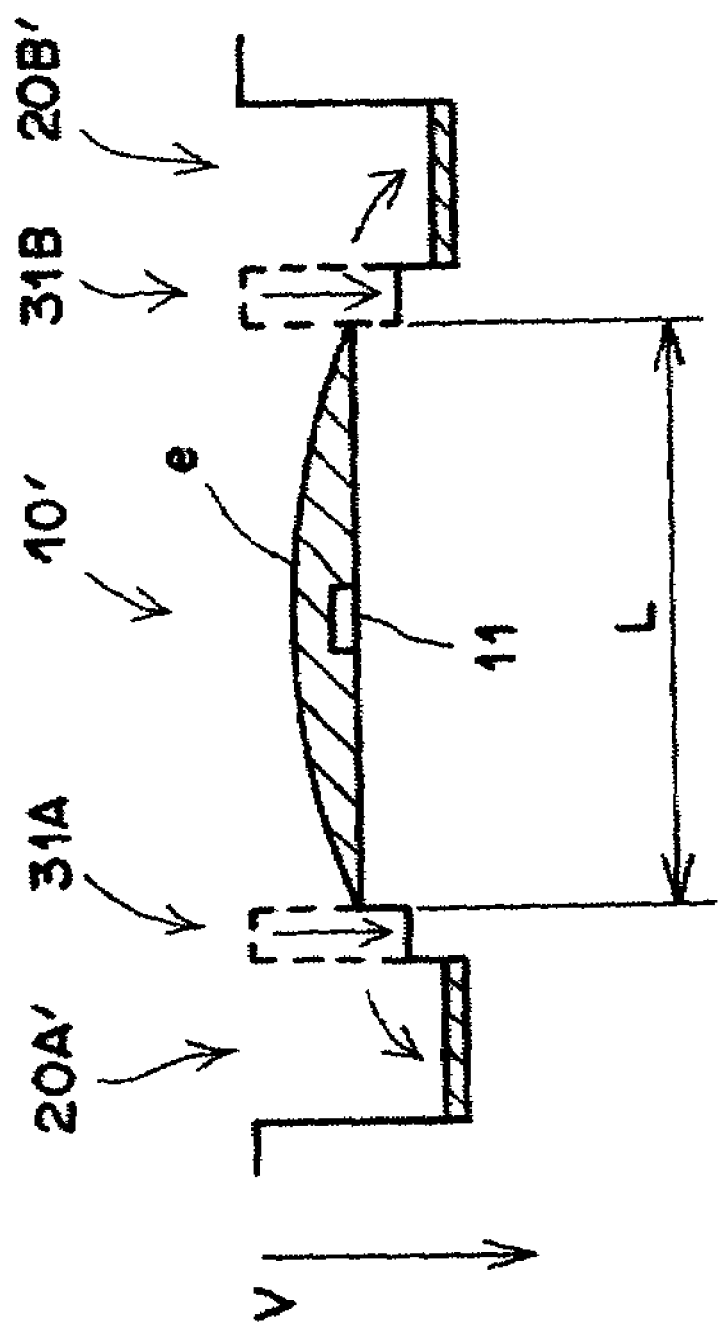
FIG. 5 is a diagram showing a potential distribution at a section taken along a line E-E' of FIG. 4.
Figure 6:
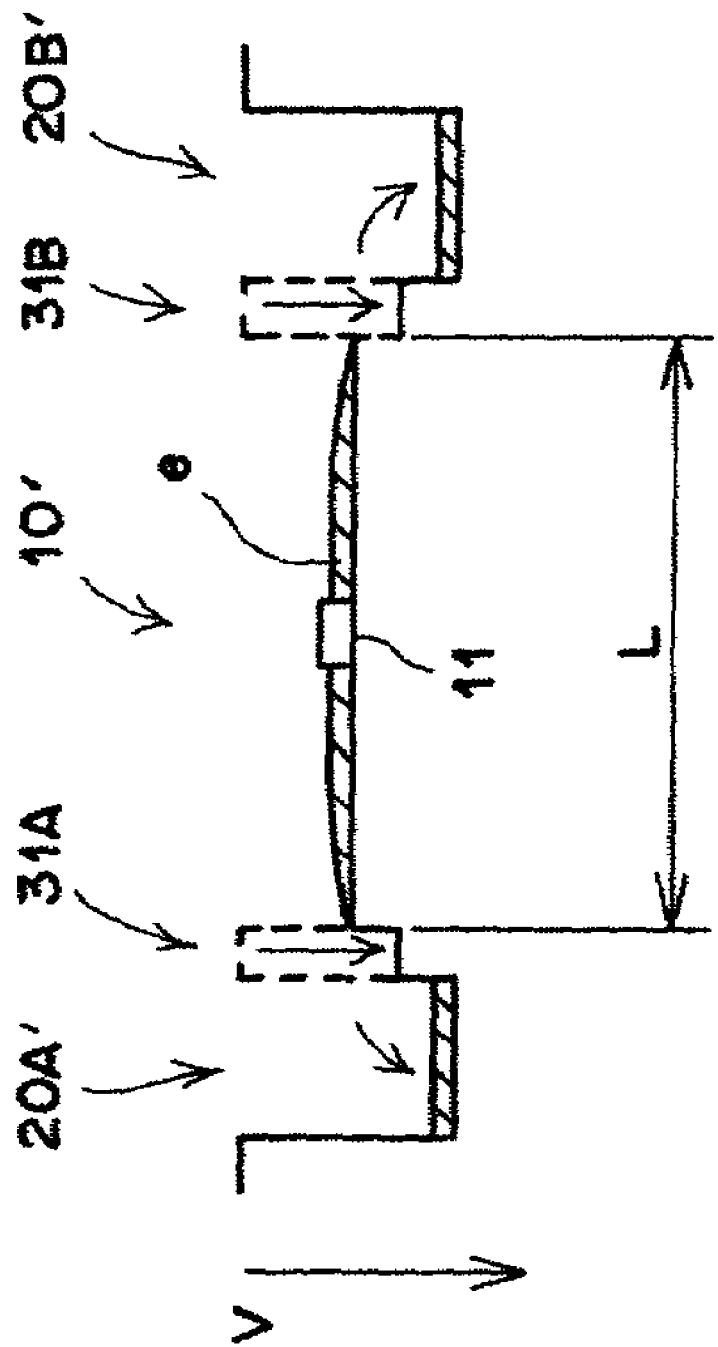
FIG. 6 is a diagram showing a potential distribution at the section taken along the line E-E' in the case of a small amount of charges.

FIG. 4 is a schematic view showing a constitution of a solid-state imaging device of a second embodiment, carrying out the charge read-out method of the present invention. FIGS. 5 and 6 are diagrams showing potential distributions at the section taken along a line E-E' of FIG. 4. In the solid-state imaging device according to the second embodiment, each of the light receiving units is divided into a plurality of segments with a potential barrier. In the following description, the same reference numerals will be used for the same structures as in the solid-state imaging device of the first embodiment, and the description thereof will be omitted.

As shown in FIG. 4, a solid-state imaging device 100' of the second embodiment includes a plurality of light receiving units 10'-1, 10'-2, 10'-3 . . . (hereinafter, the light receiving units 10'-1, 10'-2, 10'-3 . . . are referred to as light receiving units 10') each having four light receiving segments (light receiving segments P1, P2, P3 and P4) separated by a cruciform potential barrier; charge transfer paths 20A'-1 and 20B'-1 for light receiving unit 10'-1 each having two transfer electrodes (transfer electrodes Q1 and Q2, Q3 and Q4, respectively) provided corresponding to the light receiving segments; charge transfer paths 20'A-2 and 20B'-2 for light receiving unit 10'-2 . . . (hereinafter, the charge transfer paths 20A'-1, 20A'-2, 20A'-3 . . . are collectively referred to as transfer path 20A', and the charge transfer paths 20B'-1, 20B'-2, 20B'-3 . . . are collectively referred to as transfer path 20B'). Other structures are the same as those in the radiation image processing device of the first embodiment.

Next, the operation of the solid state imaging device according to the second embodiment will be described.

In the light receiving unit 10'-1 having received stimulated emission light generated from a storage phosphor sheet (not shown) by scanning with excitation light, charges are generated and stored. When the scanning with the excitation light is finished, potentials of the transfer gates 31A and 31B, which are disposed along the row of the light receiving units 10' on both sides thereof, are lowered (gates are opened) by an instruction of the controller 30, and the charges generated in the light receiving unit 10'-1 are started to move to the charge transfer paths 20A'-1 and 20B'-1. The charges stored in the light receiving unit 10'-1 are moved through the transfer gates 31A and 31B to the corresponding transfer electrodes.

In this case, a potential barrier 11 in the light receiving unit 10'-1 is set to have a potential a little lower than the other area thereof. Accordingly, in the case of a large amount of charges, the charges in the light receiving unit are moved to the charge transfer paths 20A'-1 and 20B'-1 without taking any influence of the potential barrier 11 (see FIG. 5). However, when the amount of charges is decreased with progress of the movement of the charges to the charge transfer unit, and the charges are moved mainly by thermal diffusion, as shown in FIG. 6, the charges cannot move over the potential barrier 11. The charges in each of the light receiving segments P1, P2, P3 and P4 can only move to the transfer electrodes Q1, Q2, Q3 and Q4 corresponding to the light receiving segments, respectively. Therefore, the time required for moving the charges in the light receiving unit to the charge transfer unit can be shortened. Note that the above operation is common to the other light receiving units 10'-2, 10'-3 . . .

When all the charges which had been stored in light receiving unit 10' are moved to the charge transfer paths 20A'-1 and 20B'-1, the charges moved to each of the transfer electrodes are transferred to the output unit 40 by control of the controller 30. In this case, the charge moving speed in each of the transfer electrodes is varied in accordance with the dimension of each of the transfer electrodes in a charge transfer direction. Specifically, the charge moving speed is increased as the dimension of each of the transfer electrodes in the charge transfer direction is smaller. In other words, by dividing the transfer electrode thereby shortening the travel distance of the charge within the transfer electrode, the travel speed of the charge increases, and the time required for the charge to travel a given distance is shortened.

Therefore, compared to the charge transfer paths provided with transfer electrodes in accordance with the dimensions of the light receiving units, for example, the charge transfer paths of the first embodiment, the charges in the transfer paths are transferred to the output unit in a shorter time through the charge transfer path, each being provided with transfer electrodes in accordance with the dimensions of the light receiving segments as described above.

The aforementioned potential barrier is formed in the following manner. A second conductive impurity layer (N layer or P layer) is selectively formed in a first conductive impurity layer (P layer or N layer). In the second conductive impurity layer having a surface covered with a first conductive high density layer in the light receiving unit, the second conductive impurity layer of a relative low density or the first conductive impurity layer of a relative low density are disposed.

Figure 7:
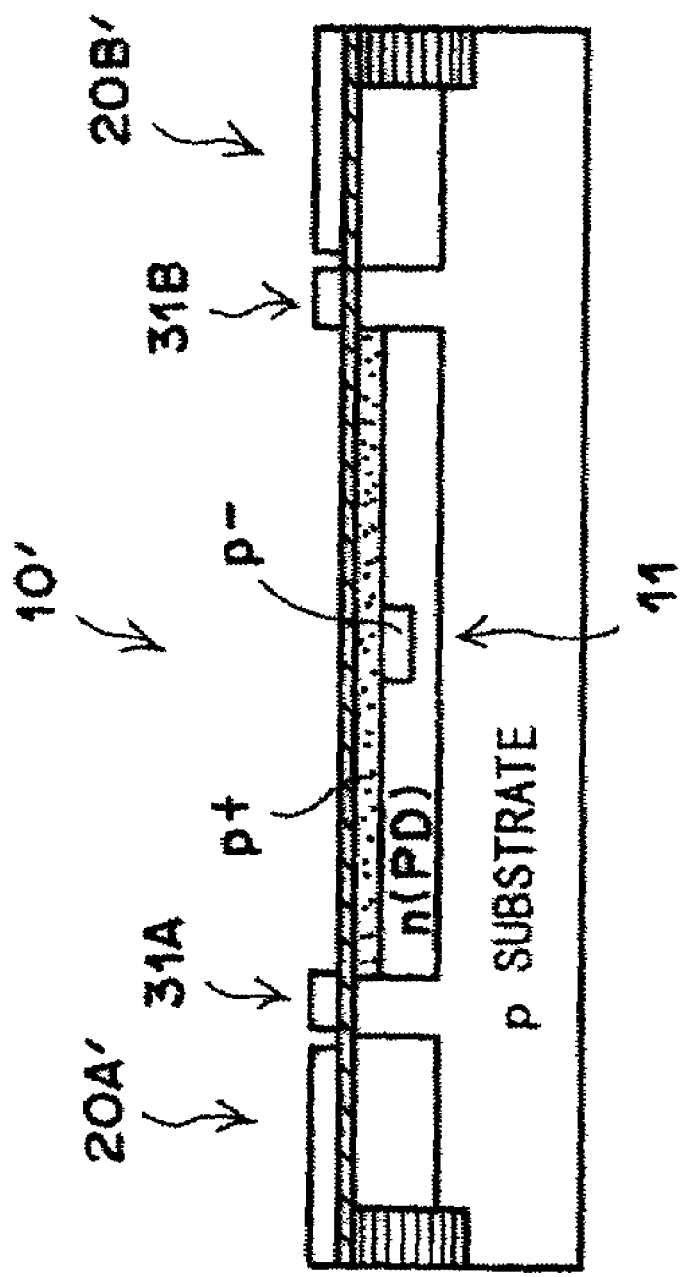
FIG. 7 is a view showing a structure at the section taken along the line E-E'.

More specifically, as shown in FIG. 7 showing the section taken along the line E-E' of FIG. 4, a p-type impurity layer is formed in the light receiving unit composed of a buried diode of a PNP structure formed on a p-type substrate. The impurity layer is maintained to constantly have a lower potential than that in the other areas, thus forming the potential barrier.

Incidentally, it is satisfactory for the effect of dividing the light receiving unit to appear in a state where the amount of charges in the light receiving unit is decreased, so that only a very small potential difference needs to be generated between the potential barrier and the other areas in the light receiving surface. In other words, the above impurity layer for forming the potential barrier is made to be in a depletion state. The charges generated by light incident on the surface having the potential barrier formed flow into each of the segments without recoupling in the impurity layer, which is in the above depletion state. Such structure is significantly different from channel stop Cs (see FIGS. 4 and 8),which are a high density P layer in which depletion does not appear in order to be certain to electrically separate the light receiving units.

Figure 8:
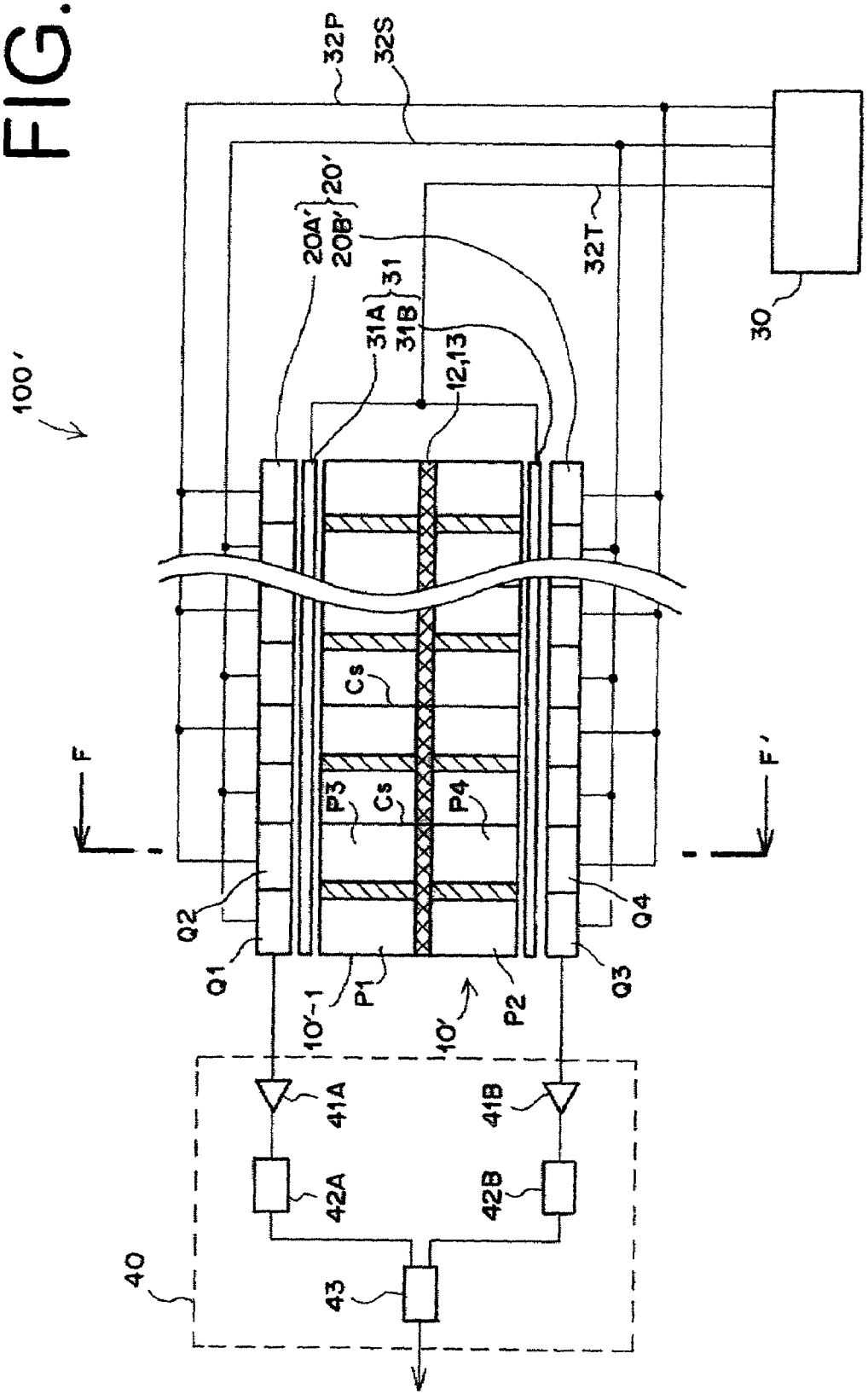
FIG. 8 is a schematic view showing a structure of a solid-state imaging device using a MOS type split gate for formation of a potential barrier.
Figure 9:
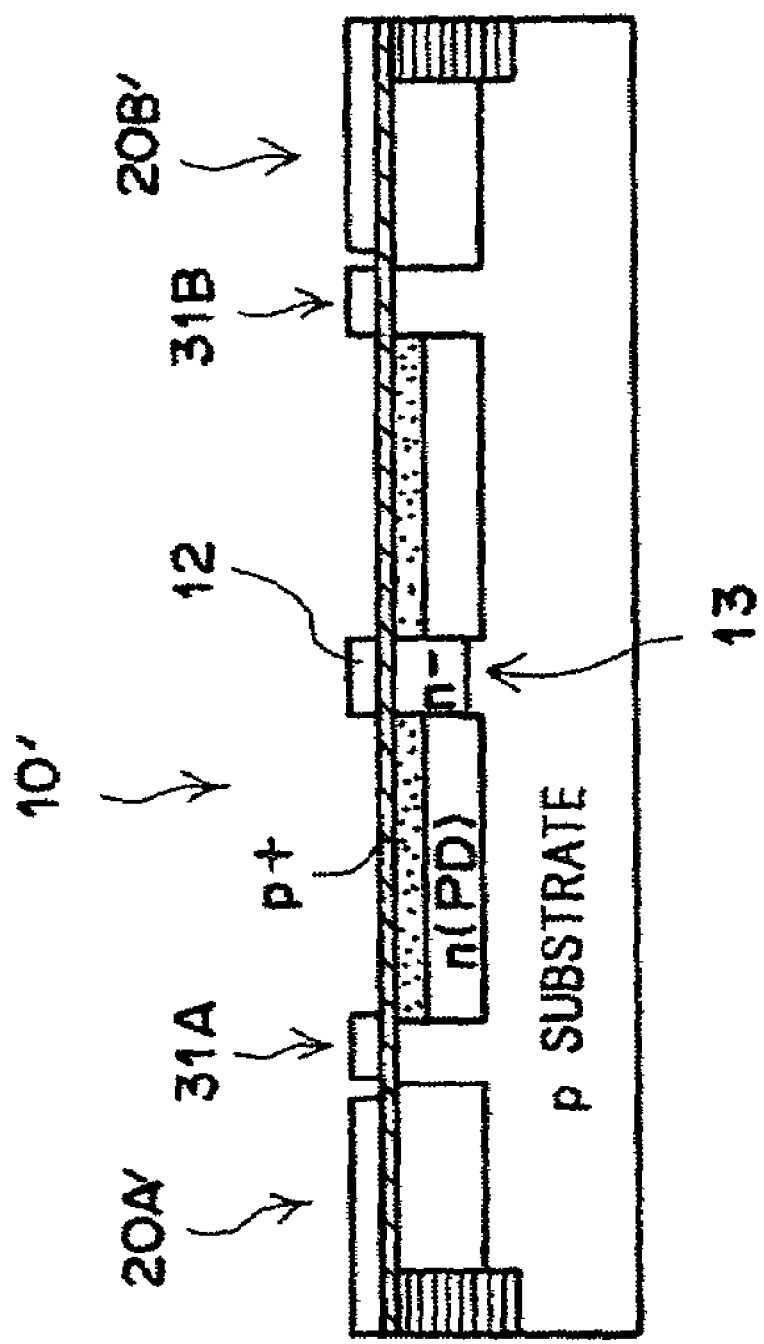
FIG. 9 is a view showing a sectional structure of the potential barrier using a MOS type split gate.

As shown in FIG. 8 and FIG. 9 showing a section taken along a line F-F' of FIG. 8, a MOS type split gate 13 having a transparent electrode 12 made of polysilicon on the top surface of the light receiving units may be formed in the light receiving units along the row of the light receiving units, so that the split gate 13 may be adapted to serve as the potential barrier by controlling the potential of the split gate 13 from the outside.

When the potential barrier is formed by the above-described structure, the potential barrier can be provided in each of the light receiving units without impeding the photoelectric conversion function of the light receiving units.

Figure 10:
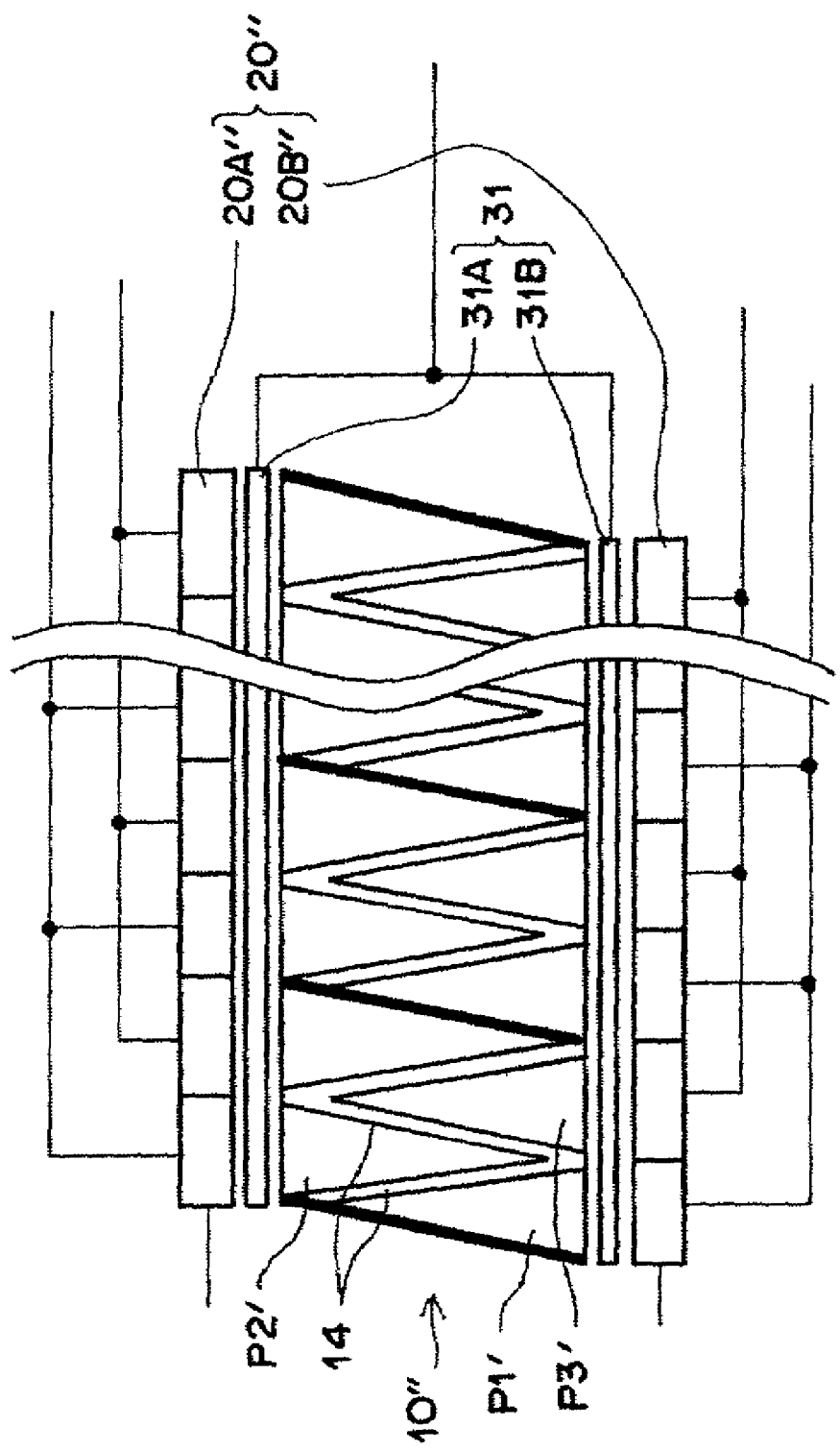
FIG. 10 is a view showing a structure of the light receiving units each having triangular light receiving segments.

As shown in FIG. 10, each of light receiving units 10" may be diagonally divided with a potential barrier 14 to form triangular light receiving segments P1', P2', P3' . . . . In the triangle receiving segments formed in such a manner, a potential gradient is generated from an area of a small width in a vicinity of a vertex of each of the triangle light receiving segments toward an area of a larger width therein by a narrow channel effect caused by a pn junction of the semiconductor device. Accordingly, the movement of the charges in the triangular light receiving segments to the charge transfer unit can be accelerated, thus shortening the time for moving the charges from the light receiving segments P1', P2', P3' . . . to the transfer gates 31A and 31B through the charge transfer paths 20A" and 20B".

What is claimed is:

1. A solid-state imaging device comprising:
a plurality of light receiving units arranged linearly for receiving light to generate and store charges;
a plurality of charge transfer paths disposed on both sides of said plurality of light receiving units for receiving the charges exiting from said plurality of light receiving units and for transferring and outputting the received charges;
a controller for moving the charges stored in said plurality of light receiving units into said plurality of charge transfer paths, and for transferring at substantially the same time and outputting the charges moved into said plurality of charge transfer paths disposed on both sides of said plurality of light receiving units, wherein each of said plurality of light receiving units comprises a plurality of segments separated by an internal potential barrier so that charges stored in said plurality of light receiving units are moved to said plurality of charge transfer paths; and
an addition unit for obtaining a signal value indicating quantity of light received by a light receiving unit from the plurality of light receiving units, wherein the signal value is obtained by adding charges that have been accumulated in the same light receiving unit and that were separated to move through different light receiving paths positioned on each side of the same light receiving unit, wherein said each of said plurality of light receiving units is a single, integrally formed, storage container for the received charges, and wherein the plurality of segments are four segments obtained by separating each of said plurality of light receiving units with an internal cruciform potential barrier.

2. The solid-state imaging device according to claim 1, wherein the internal barrier comprises: a first conductive impurity layer and a second conductive impurity layer selectively formed on top of the first conductive impurity layer, the second conductive impurity layer has a surface covered with a first conductive high density layer in a light receiving unit from the plurality of light receiving units, and wherein the second conductive impurity layer or the first conductive impurity layer is of relative low density.

3. The solid-state imaging device according to claim 1, wherein the internal barrier comprises a PNP structure formed on a p-substrate.

4. The solid-state imaging device according to claim 1, wherein the internal barrier is provided without impeding photoelectric conversion of its respective light receiving unit.

5. The solid-state imaging device according to claim 1, wherein the internal potential barrier diagonally divides a light receiving unit from the plurality of light receiving units into segments.

6. The solid-state imaging device according to claim 1, wherein the plurality of charge transfer paths are vertical paths disposed on both sides of each of said plurality of light receiving units, and wherein charges exiting from each of said plurality of light receiving units are received by charge transfers paths on both sides of a respective light receiving unit and are subsequently converted into digital values by a converter.

7. The solid-state imaging device according to claim 1, wherein said each light receiving unit stores generated charges for at most a single pixel and wherein said each light receiving unit has at least two exits for the charges.

8. The solid-state imaging device according to claim 7, wherein each of the at least two exits is connected to a separate charge transfer path of said plurality of charge transfer paths, and wherein the plurality of charge transfer paths transfer the charges to a converter converting the charges to digital values.

9. The solid-state imaging device according to claim 1, wherein said plurality of charge transfer paths are common, vertical charge transfer paths for transferring charges subsequently read.

10. The solid-state imaging device according to claim 1, wherein each of said plurality of charge transfer paths transfer charges from more than one light receiving unit.

11. A solid-state imaging device comprising:

a plurality of light receiving units arranged linearly for receiving light to generate and store charges;

a plurality of charge transfer paths disposed on both sides of said plurality of light receiving units for receiving the charges exiting from said plurality of light receiving units and for transferring and outputting the received charges;

a controller for moving the charges stored in said plurality of light receiving units into said plurality of charge transfer paths, and for transferring and outputting the charges moved into said plurality of charge transfer paths disposed on both sides of said plurality of light receiving units, wherein each of said plurality of light receiving units includes comprises a plurality of segments separated by an internal potential barrier so that charges stored in said plurality of light receiving units are moved to said plurality of charge transfer paths; and an addition unit for obtaining a signal value indicating quantity of light received by a light receiving unit from the plurality of light receiving units, wherein the signal value is obtained by adding charges that have been accumulated in the same light receiving unit and that were separated to move through different light receiving paths positioned on each side of the same light receiving unit, wherein said each of said plurality of light receiving units is a single, integrally formed, storage container for the received charges, and wherein the segments separated by the internal potential barrier are triangularly shaped.

* * * * *